United States Patent
Tamura et al.

(10) Patent No.: US 9,528,684 B2
(45) Date of Patent: Dec. 27, 2016

(54) LIGHT CONVERTER EMITTING ILLUMINATION LIGHT AND LIGHT SOURCE APPARATUS USING THE LIGHT CONVERTER

(71) Applicant: OLYMPUS CORPORATION, Tokyo (JP)

(72) Inventors: Kazuaki Tamura, Hachioji (JP);
Masahiro Nishio, Hachioji (JP);
Hiroyuki Kamee, Koganei (JP)

(73) Assignee: OLYMPUS CORPORATION, Tokyo (JP)

( * ) Notice: Subject to any disclaimer, the term of this patent is extended or adjusted under 35 U.S.C. 154(b) by 38 days.

(21) Appl. No.: 14/579,473

(22) Filed: Dec. 22, 2014

(65) Prior Publication Data

US 2015/0103554 A1    Apr. 16, 2015

Related U.S. Application Data

(63) Continuation of application No. PCT/JP2013/067537, filed on Jun. 26, 2013.

(30) Foreign Application Priority Data

Jun. 27, 2012    (JP) .................................. 2012-144541

(51) Int. Cl.
*F21V 7/04*    (2006.01)
*F21V 9/08*    (2006.01)
(Continued)

(52) U.S. Cl.
CPC ................ *F21V 9/08* (2013.01); *F21V 13/08* (2013.01); *H01S 5/005* (2013.01);
(Continued)

(58) Field of Classification Search
CPC ................ F21K 9/52; F21K 9/54; F21K 9/56; F21K 99/00; F21V 9/08; F21V 13/08; G02B 6/005; G02B 6/0006; G02B 6/0008; H01S 5/005; H01S 5/02284
See application file for complete search history.

(56) References Cited

U.S. PATENT DOCUMENTS

2011/0157865 A1    6/2011    Takahashi et al.
2011/0279039 A1    11/2011   Kishimoto
(Continued)

FOREIGN PATENT DOCUMENTS

| JP | 200828245 A | 2/2008 |
|----|-------------|--------|
| JP | 2011243376 A | 12/2011 |
| JP | 201264597 A | 3/2012 |

OTHER PUBLICATIONS

International Search Report dated Sep. 24, 2013 received in PCT/JP2013/067537.
(Continued)

*Primary Examiner* — Y M Lee
(74) *Attorney, Agent, or Firm* — Scully, Scott, Murphy & Presser, P.C.

(57) ABSTRACT

A light source apparatus includes a light conversion unit converting primary light into secondary light. The light conversion unit includes a light conversion member, a holder and a reflection member. The holder includes an incidence portion through which the primary light enters and an exit portion through which at least part of the secondary light exits in a direction crossing an optical axis of the primary light. The light conversion member is arranged on the optical axis of the primary light. Part of the secondary light allowed to exit from the light conversion member in a direction different from a direction toward the exit portion is reflected by the reflection member and exited from the exit portion. The ratio of reentering to the light conversion member is reduced.

23 Claims, 6 Drawing Sheets

(51) Int. Cl.
    *H01S 5/00*          (2006.01)
    *H01S 5/022*        (2006.01)
    *F21V 13/08*        (2006.01)
    *F21V 8/00*         (2006.01)
    *F21K 99/00*        (2016.01)

(52) U.S. Cl.
    CPC ............ *H01S 5/02284* (2013.01); *F21K 9/52* (2013.01); *F21K 9/54* (2013.01); *F21K 9/56* (2013.01); *F21K 99/00* (2013.01); *G02B 6/0006* (2013.01); *G02B 6/0008* (2013.01)

(56) References Cited

U.S. PATENT DOCUMENTS

2012/0026721 A1*   2/2012   Kurt et al. ................ F21K 9/56
                                                                            362/84
2013/0271953 A1*  10/2013   Wu et al. .................. F21K 9/54
                                                                            362/84

OTHER PUBLICATIONS

English translation of International Preliminary Report on Patentability together with the Written Opinion dated Jan. 8, 2015 received in related International Application No. PCT/JP2013/067537.
Japanese Office Action dated Apr. 19, 2016 in related Japanese Patent Application No. 2012-144541.

* cited by examiner

LIGHT CONVERTER EMITTING ILLUMINATION LIGHT AND LIGHT SOURCE APPARATUS USING THE LIGHT CONVERTER

CROSS-REFERENCE TO RELATED APPLICATIONS

This application is a Continuation Application of PCT Application No. PCT/JP2013/067537, filed Jun. 26, 2013 and based upon and claiming the benefit of priority from Japanese Patent Application No. 2012-144541, filed Jun. 27, 2012, the entire contents of all of which are incorporated herein by references.

BACKGROUND OF THE INVENTION

1. Field of the Invention

The present invention relates to a light source apparatus that converts primary light emitted from a light source into secondary light having desired optical properties and applies it to the outside.

2. Description of the Related Art

There has been developed a light source apparatus that guides primary light emitted from a small light source through a light guide member and converts a wavelength by a wavelength conversion member arranged on a distal end side of the light guide member to change the primary light to secondary light having a desired color or irradiation pattern.

For example, Jpn. Pat. Appln. KOKAI Publication No. 2008-28245 discloses a light emitting apparatus that guides a laser beam emitted from a semiconductor laser device through a light guide member, irradiates a wavelength conversion member arranged near an end face of the light guide member on an exit end side with the laser beam, and laterally radiates light into which the wavelength has been converted from an opening portion arranged in a region different from a central axis (an optical axis) of the light guide member.

BRIEF SUMMARY OF THE INVENTION

According to an embodiment of the present invention, there is provided a light source apparatus comprising a primary light source which emits primary light, a light guide member which guides the primary light emitted from the primary light source, and a light conversion unit that converts the primary light guided by the light guide member into secondary light having desired optical properties and allows illumination light including the primary light and the secondary light to exit therefrom, wherein the light conversion unit comprises a light conversion member which converts the primary light into the secondary light and radiates the converted light, a holder which holds the light conversion member, and a reflection member which reflects the secondary light, the holder comprises an incidence portion through which the primary light enters from the light guide member, and an exit portion through which at least part of the secondary light exits in a direction crossing an optical axis of the primary light that enters from the incidence portion, the light conversion member is arranged on the optical axis of the primary light that enters from the incidence portion, and part of the secondary light allowed to exit from the light conversion member in a direction different from a direction extending to the exit portion is reflected by the reflection member and allowed to exit from the exit portion to the outside without reentering the light conversion member.

Advantages of the invention will be set forth in the description which follows, and in part will be obvious from the description, or may be learned by practice of the invention. The advantages of the invention may be realized and obtained by means of the instrumentalities and combinations particularly pointed out hereinafter.

BRIEF DESCRIPTION OF THE SEVERAL VIEWS OF THE DRAWINGS

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE PREFERRED EMBODIMENT

Figure 1:
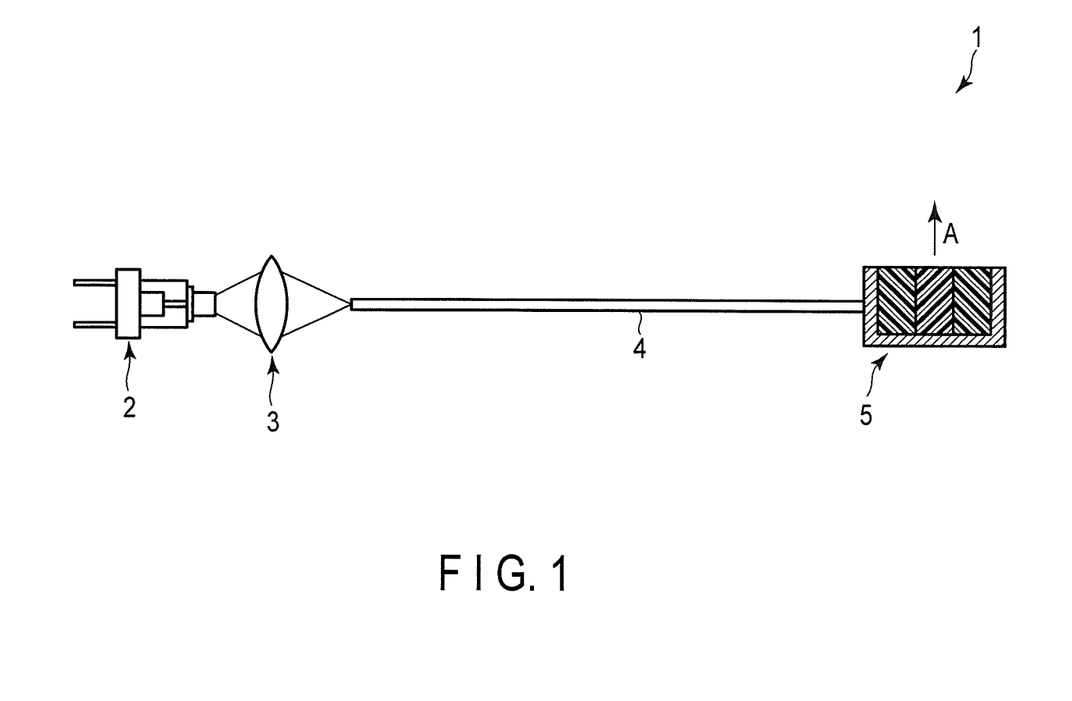
FIG. 1 is a view showing an entire configuration of a light source apparatus according to the present invention.

FIG. 1 is a view showing an entire configuration of a light source apparatus 1 according to the present invention.

The light source apparatus 1 comprises a primary light source 2, a light condensing optical system 3, a light guide member 4, and a light conversion unit 5. Primary light emitted from the primary light source 2 is condensed by the light condensing optical system 3, guided through the light guide member 4, and applied to the inside of the light conversion unit 5. Further, the light conversion unit 5 allows illumination light including the primary light and secondary light, which has been converted to have optical properties different from those of the primary light, to exit in a direction different from an optical axis of the primary light exiting from the light guide member 4. The respective constituent sections will now be described in detail hereinafter.

The primary light source 2 is, e.g., a semiconductor laser beam source that emits a laser beam based on a predetermined driving current and at lighting intervals. The primary light is a laser beam in a wavelength domain of visible light, e.g., a laser beam having a center wavelength of 445 nm and also excitation light that causes excitation to a belowmentioned wavelength conversion member 7 which is a light conversion member in the light conversion unit 5.

The light condensing optical system 3 is arranged between the primary light source 2 and the light guide member 4. The light condensing optical system 3 has a convex lens that condenses the excitation light emitted from the primary light source 2 into the light guide member 4.

The light guide member 4 is, e.g., an optical fiber 4 formed of a core and a cladding that covers an outer peripheral surface of the core. The optical fiber 4 is, e.g., a multimode optical fiber having a core diameter $\phi$=50 μm and a numerical aperture FNA=0.2. A refractive index of the core is higher than a refractive index of the cladding to totally reflect the excitation light on the cladding and efficiently guide the excitation light in the core. The cladding and the core are made of glass or plastic. The optical fiber 4 guides the excitation light condensed by the light condensing optical system 3 and applies the excitation light to the inside of the light conversion unit 5 connected to an optical fiber exit end 4a on a distal end side in an optical axis direction.

A ferrule 6 that holds the optical fiber exit end 4a side is provided at a connecting portion of the optical fiber exit end 4a and the light conversion unit 5. The ferrule 6 holds the optical fiber 4 so that the optical fiber exit end 4a is located on substantially the same plane as an end face of the ferrule 6. The ferrule 6 has, e.g., a cylindrical shape and is made of zirconia or nickel as main components.

The light conversion unit 5 is arranged in front of the optical fiber exit end 4a in an exiting (traveling) direction of the excitation light exiting from the optical fiber exit end 4a. The light conversion unit 5 receives the excitation light guided through the optical fiber 4, performs the wavelength conversion to convert part of the excitation light into light having desired optical properties (wavelength converted light) in a wavelength domain different from that of the excitation light, and allows illumination light including the excitation light and the wavelength converted light to exit in a direction (which is indicated by, e.g., an arrow A in FIG. 1) crossing an optical axis of the excitation light exiting from the optical fiber exit end 4a.

The light conversion unit 5 of the light source apparatus 1 according to a first embodiment of the present invention will now be described with reference to FIG. 2 to FIG. 5.

First Embodiment

Figure 2:
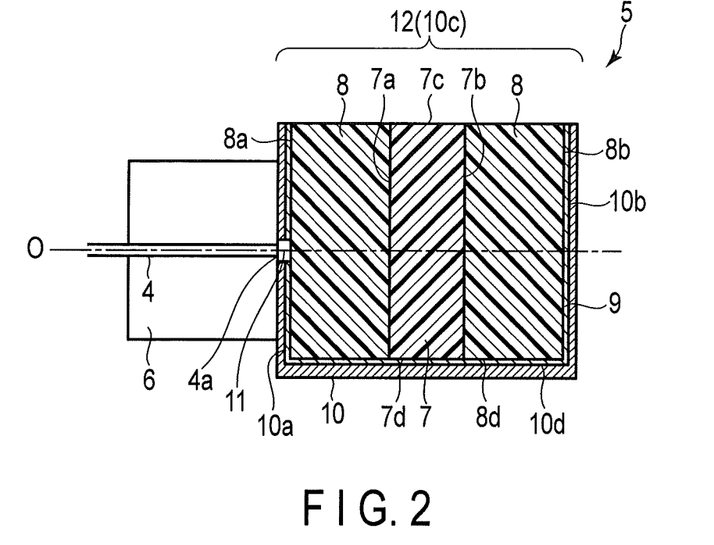
FIG. 2 is a transverse cross-sectional view of a light conversion unit according to a first embodiment.
Figure 3:
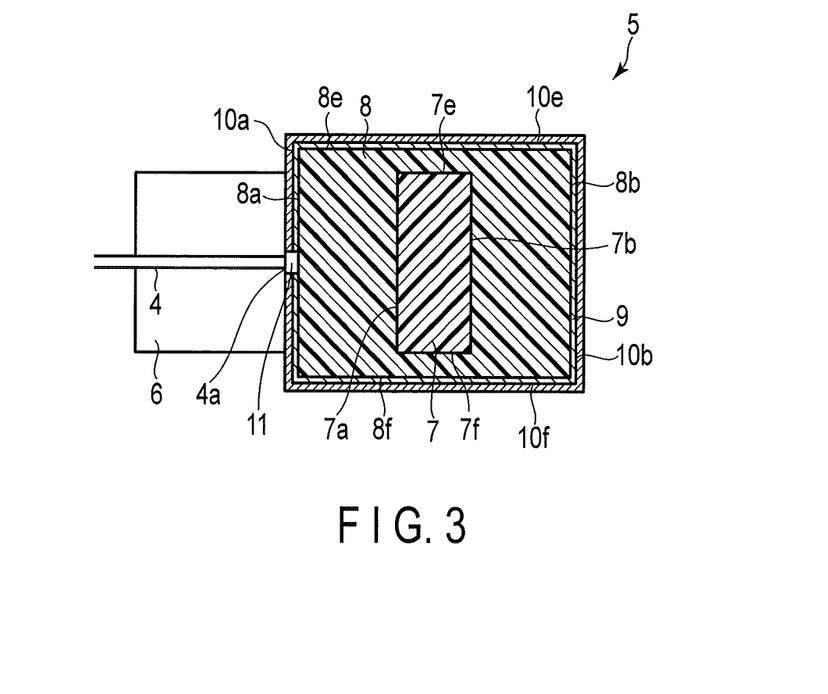
FIG. 3 is an upper cross-sectional view of the light conversion unit according to the first embodiment.
Figure 4:
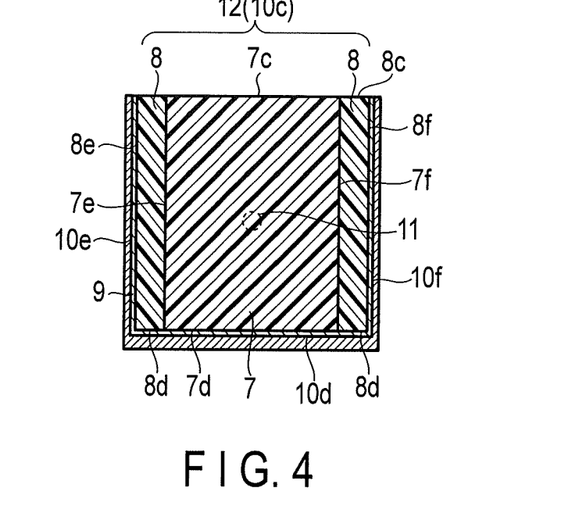
FIG. 4 is a longitudinal cross-sectional view of the light conversion unit according to the first embodiment.

FIG. 2 to FIG. 4 are views showing the light conversion unit 5 of the light source apparatus 1 according to the first embodiment.

The light conversion unit 5 has a wavelength conversion member 7, a light transmission member 8, a reflection member 9, and a holder 10. The wavelength conversion member 7 in the present embodiment is a light conversion member that absorbs part of the excitation light guided through the optical fiber 4 and converts the absorbed excitation light into light in a wavelength domain on a longer wavelength than the excitation light.

A configuration of the light conversion unit 5 will be first explained.

The wavelength conversion member 7 is formed by, e.g., dispersing phosphor powder represented as $Y_3Al_5O_{12}$:Ce (which will be written as YAG hereinafter) into a sealing material such as a silicone resin or glass and solidifying the sealing material. A thickness of the wavelength conversion member 7 and concentration conditions of the phosphor powder mixed in the sealing material are set to predetermined conditions required to convert the excitation light into desired wavelength converted light while considering properties such as an excitation light absorption factor or wavelength conversion efficiency of the wavelength conversion member 7. As a material of the wavelength conversion member 7, it is also possible to use polycrystallized YAG ceramics having a thermal conductivity of approximately 10 W/mK.

The wavelength conversion member 7 has a rectangular column shape formed of six surfaces, 7a to 7f, as shown in FIG. 2 to FIG. 4. That is, the wavelength conversion member 7 has a light receiving surface that receives the excitation light exiting from the optical fiber exit end 4a, i.e., a first side surface 7a, a second side surface 7b facing the first side surface 7a, an exit surface from which the wavelength converted light radiated from the inside of the wavelength conversion member 7 exits to the outside of the light conversion unit 5, i.e., a top surface 7c, a bottom surface 7d facing the top face 7c, and a third side surface 7e and a fourth side surface 7f that are bounded on these surfaces. An area of the light receiving surface 7a is set to be larger than an area of a beam spot formed on the wavelength conversion member 7 by the excitation light that enters from the optical fiber exit end 4a.

The light transmission member 8 is made of glass or a silicone resin having a high light transmittance and has properties of transmitting the excitation light exiting from the optical fiber exit end 4a and the wavelength converted light radiated from the wavelength conversion member 7 therethrough.

The light transmission member 8 has a surface 8a to a surface 8f. Specifically, it has an incidence surface from which the excitation light exiting from the optical fiber exit end 4a enters, i.e., a first side surface 8a, a second side surface 8b facing the first side surface 8a, an exit surface from which the excitation light and the wavelength converted light exit in a direction crossing the optical axis of the excitation light exiting from the optical fiber exit end 4a, i.e., a top surface 8c, a bottom surface 8d facing the top surface 8c, and a third side surface 8e and a fourth side surface 8f that are bounded on these surfaces.

The holder 10 has a function of holding the wavelength converted member 7 and the light transmission member 8. The holder 10 is made of a metal such as nickel or stainless steel and has a higher thermal conductivity than that of the wavelength conversion member 7 or the light transmission member 8.

The holder 10 has five surfaces, 10a, 10b, and 10d to 10f, and it is a rectangular cup-shaped member having an opened top surface. That is, the holder 10 has a holder incidence surface from which the excitation light exiting from the optical fiber exit end 4a enters, i.e., a first holder side surface 10a, a second holder side surface 10b facing the first holder side surface 10a, a holder bottom surface 10d parallel to the optical axis of the excitation light entering from the first holder side surface 10a, and a third holder side surface 10e and a fourth holder side surface 10f that are bounded on these surfaces.

An incidence portion 11 from which the excitation light exiting from the optical fiber exit end 4a enters is provided to the holder incidence surface 10a. Further, a holder opening 10c opposite to the holder bottom surface 10d constitutes an exit portion 12 from which illumination light including the excitation light and the wavelength converted light exits in a direction crossing the optical axis of the excitation light that enters from the incidence portion 11.

A rectangular column shaped concave portion sectioned by the first to fourth holder side surfaces 10a, 10b, 10e, and 10f and the holder bottom surface 10d is formed in the holder 10, and the exit portion 12 (the holder opening 10c) is an opening region of the concave portion. The light transmission member 8 and the wavelength conversion member 7 surrounded by the light transmission member 8 are arranged and held in the concave portion. In the present embodiment, an exit surface 7c of the wavelength conversion member 7 and the exit surface 8c of the light transmission member 8 are exposed to the outside and are substantially flush with each other. However, the present invention is not restricted thereto, and the exit surfaces 7c and 8c may be flat surfaces having different heights.

The wavelength conversion member 7 is arranged on at least the optical axis of the excitation light that enters from the incidence portion 11 of the holder 10. Furthermore, in the present embodiment, an opening surface of the holder opening 10c is substantially flush with the exit surface 8c of the light transmission member 8. However, the present invention is not restricted to this example, and the opening surface of the holder opening 10 and the exit surface 8c may be flat surfaces having different heights.

The reflection member 9 is formed on an inner surface of the holder 10 except the incidence portion 11 and the exit portion 12, that performs specular reflection or diffuse reflection with respect to the excitation light that has entered from the incidence portion 11 and the wavelength converted light radiated from the wavelength conversion member 7. At least part of the reflection member 9 is arranged on the optical axis of the excitation light that enters from the incidence portion 11. Moreover, the reflection member 9 is arranged away from the wavelength conversion member 7 on the optical axis of the excitation light that enters from the incidence portion 11. In the present embodiment, the first side surface 7a and the second side surface 7b of the wavelength conversion member 7 are arranged away from the first side surface 10a (the incidence portion 11) and the second side surface 10a of the holder 10 on which the reflection member 9 is formed.

The reflection member 9 is, e.g., a metal reflection film formed by thinly plating the inner surface of the holder 10 with a metal such as silver or aluminum. If the metal reflection film has high reflectivity, its metallic material is not restricted in particular, an alloy may be adopted, and the metal reflection film can be formed by using an evaporation method, a sputtering method, a CVD method, or the like besides the plating method in a manufacturing method. Like the holder 10, the reflection member 9 has higher thermal conductivity than the wavelength conversion member 7 or the light transmission member 8.

As shown in FIG. 2 and FIG. 4, on the holder bottom surface 10d, the bottom surface 7d of the wavelength conversion member 7 is in contact with the reflection member 9. When the wavelength conversion member 7 absorbs the excitation light and performs the wavelength conversion, it causes an energy loss due to the wavelength conversion as heat. In the present embodiment, since the wavelength conversion member 7 is arranged in contact with the reflection member 9 made of a metal material on the holder bottom surface 10d, local heat generation that occurs at an intersection of the optical axis of the excitation light and the incidence surface 7a of the wavelength conversion member 7 is diffused and exhausted in a direction of the holder bottom surface 10d to alleviate the heat generation.

In addition, it is preferable to fill the incidence portion 11 with a transparent silicone resin to bond the light transmission member 8 with the holder 10 and match a refractive index of the optical fiber exit end 4a with that of the light transmission member 8.

A description will now be given as to an operation in which the excitation light enters from the incidence portion 11 and the excitation light and the wavelength converted light are allowed to exit from the exit portion 12 in the light conversion unit 5.

Figure 5:
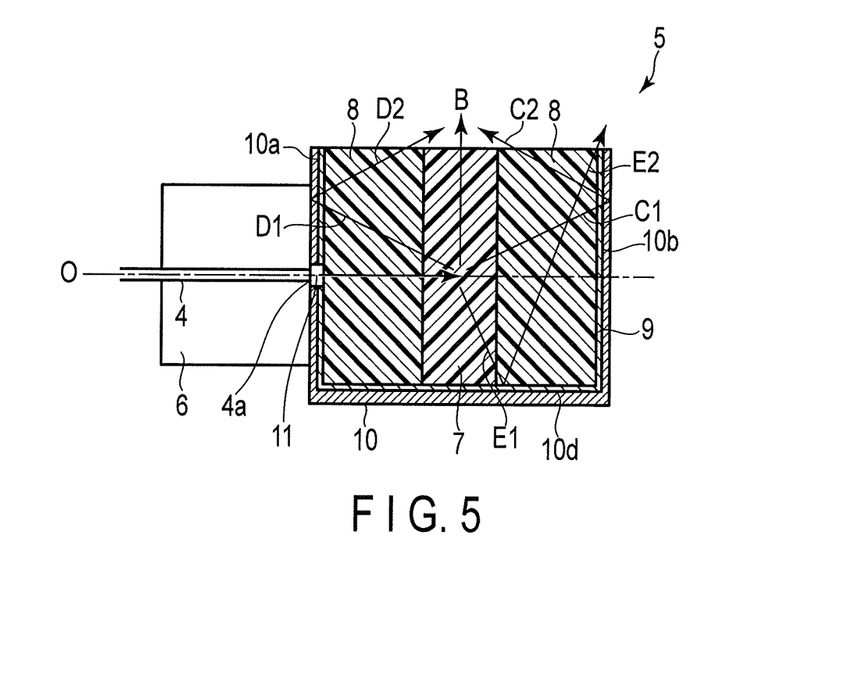
FIG. 5 is a view schematically showing excitation light and wavelength converted light in the light conversion unit according to the first embodiment.

FIG. 5 is a view schematically showing the excitation light and the wavelength converted light in the light conversion unit 5. The excitation light allowed to exit from the optical fiber exit end 4a enters the light transmission member 8 from the incidence portion 11 at a spread angle based on the numerical aperture FNA of the optical fiber 4 and the refractive index of the light transmission member 8. Additionally, the excitation light that has been transmitted through the light transmission member 8 is applied to the incidence surface 7a of the wavelength conversion member 7, part of the excitation light is absorbed, and the other part of the same is transmitted. The absorbed excitation light is subjected to the wavelength conversion by the wavelength conversion member 7 and changed into wavelength converted light, and it is isotropically radiated from the wavelength conversion member 7.

The radiated wavelength converted light can be roughly divided into a first component (indicated by an arrow B) that is transmitted through the wavelength conversion member 7 alone and directly radiated to the outside from the exit portion 12, a second component (indicated by an arrow C1) radiated to a front side in the optical axis direction of the excitation light, a third component (indicated by an arrow D1) radiated to a rear side (a direction toward the incidence portion 11) in the optical axis direction of the excitation light, a fourth component (indicated by an arrow E1) radiated toward the holder bottom surface 10d, and a component that is not shown in FIG. 5 and radiated toward the third holder side surface 10e or the fourth holder side surface 10f and reflected on them.

The second component C1 that is radiated to the front side in an acute-angled range with respect to the exiting direction of the excitation light exiting from the second side surface 7b of the wavelength conversion member 7 is transmitted through the light transmission member 8 and applied to the second holder side surface 10b arranged away from the wavelength conversion member 7. The second component C1 applied to the second holder side surface 10b is then reflected by the reflection member 9 on the second holder side surface 10b and turns to reflected light whose light path has been changed. The reflected light is divided into a component C2 allowed to exit from the exit portion 12 to the outside of the light conversion unit 5 without reentering the wavelength conversion member 7 and a non-illustrated component that stays in the holder 10 (a component that reenters the wavelength conversion member 7 or is reflected in directions of the holder bottom surface 10d, the third holder side surface 10e, or the fourth holder side surface 10f).

Further, the third component D1 radiated to the rear side in an obtuse-angled range with respect to the exiting direction of the excitation light exiting from the first side surface 7a of the wavelength conversion member 7, the fourth component E1 radiated in the direction of the holder bottom surface 10d, and the component that is not shown in FIG. 5 and radiated in the direction of the third holder side surface 10e or the fourth holder side surface 10f are likewise reflected by the reflection member 9. Reflected light of the excitation light is divided into a component allowed to exit to the outside of the light conversion unit 5 from the exit portion 12 without reentering the wavelength conversion member 7 (the third and fourth components are indicated by the arrows D2 and E2 respectively) and a component that stays in the holder 10. The component that stays in the holder is further divided into a component that is repeatedly reflected or scattered inside and leads to optical loss and a component that is further reflected by the reflection member 9 and allowed to exit from the exit portion 12 to the outside of the light conversion unit 5 without reentering the wavelength conversion member 7.

As described above, the excitation light that has entered the light conversion unit 5 from the incidence portion 11 is converted into the wavelength converted light, which is isotropically radiated, by the wavelength conversion member 7 arranged in the holder 10. Furthermore, the wavelength converted light applied from the wavelength conversion member 7 toward the first to fourth holder side surfaces 10a, 10b, 10e, and 10f and the holder bottom surface 10d, i.e., in a direction different from a direction extending from the wavelength conversion member 7 to the exit portion 12, is reflected by the reflection member 9, and at least part of the reflected wavelength converted light is transmitted through the light transmission member 8 and allowed to exit to the outside without reentering the wavelength conversion member 7.

According to the present embodiment, when the light conversion member is arranged on the optical axis of the primary light to be away from the holder side surface having the reflection member formed thereon, the secondary light isotropically exiting from the light conversion member is reflected by the reflection member on the holder side surface, then part of the reflected light exits from the light conversion unit to the outside without reentering the light conversion member, hence the secondary light can be efficiently allowed to exit from the lateral exit portion.

Furthermore, when the light conversion member is arranged in contact with part of the holder bottom surface alone, part of the secondary light radiated in a direction of the holder bottom surface is reflected by the reflection member and allowed to exit from the light conversion unit to the outside substantially without reentering the light conversion member. Therefore, the secondary light can be allowed to efficiently exit to the outside.

Moreover, since the light conversion member is in contact with the reflection member made of a metal or the holder on the holder bottom surface, heat generated in the light conversion member can be discharged to the holder side. Therefore, an increase in temperature of the light conversion member can be suppressed, and a reduction in conversion efficiently can be moderated.

Second to fifth embodiments according to the present invention will now be described hereinafter. In the following description, like reference numerals denote the same constituent members as those in the first embodiment to omit a description thereof.

Second Embodiment

Figure 6:
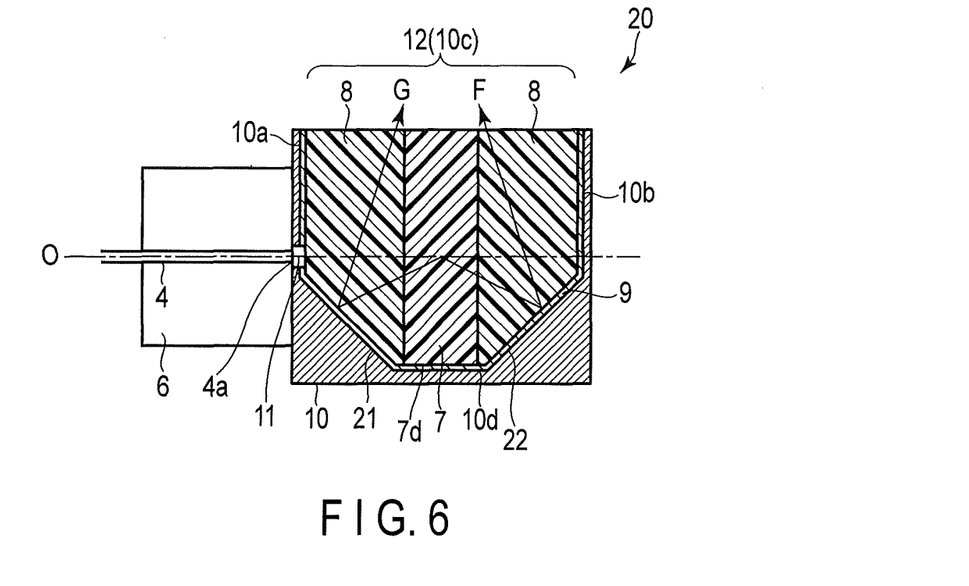
FIG. 6 is a transverse cross-sectional view of a light conversion unit according to a second embodiment.

FIG. 6 is a transverse cross-sectional view of a light conversion unit 20 of a light source apparatus according to a second embodiment.

In the second embodiment, in a holder 10, a first tapered surface 21 inclined in such a manner an area of a holder bottom surface 10d becomes smaller than an area of a holder opening 10c (an exit portion 12) is formed between a first holder side surface 10a and the holder bottom surface 10d. Moreover, a second tapered surface 22 inclined in such a manner that an area of the holder bottom surface 10d becomes smaller than the area of the holder opening 10c (the exit portion 12) is likewise formed between a second holder side surface 10b and the holder bottom surface 10d.

A reflection member 9 is also formed on the first and second tapered surfaces 21 and 22. An inclination angle of each of the first and second tapered surfaces 21 and 22 is set to fall within the range of 10° to 80° with respect to an optical axis of excitation light, or preferably approximately 45°.

It is to be noted that positions where the tapered surface is formed are not restricted thereto, and the tapered surface may be formed at all or at least one of positions between first to fourth holder side surfaces 10a, 10b, 10e, and 10f and the holder bottom surface 10d. Furthermore, a concave mirror having a parabolic surface or a spherical surface may be formed in the holder 10 without being restricted to a planar tapered surface. Moreover, a concave portion in the holder 10 may have a truncated conical shape.

A light transmission member 8 has a truncated pyramid shape adapted to a shape of the concave portion in the holder 10 having the first and second tapered surfaces 21 and 22.

In the present embodiment, of the wavelength converted light isotropically exiting from the wavelength conversion member 7, wavelength converted light radiated to a front side in an acute-angled range relative to the exiting direction of the excitation light exiting from the wavelength conversion member 7 is transmitted through the light transmission member 8 and applied to the second holder side surface 10b or the second tapered surface 22. Additionally, part of the wavelength converted light reflected on the second tapered surface 22 is allowed to exit from the exit portion 12 to the outside of the light conversion unit 20 (indicated by an arrow F). Further, wavelength converted light radiated to a rear side in an obtuse-angled range with respect to the exiting direction of the excitation light exiting from the wavelength conversion member 7 is transmitted through the light transmission member 8 and applied to the first holder side surface 10a or the first tapered surface 21. Furthermore, part of the wavelength converted light reflected on the first tapered surface 21 is allowed to exit from the exit portion 12 to the outside of the light conversion unit 20 (indicated by an arrow G).

According to the present embodiment, when the wavelength converted light exiting toward the front side and the rear side in the exiting direction of the excitation light is reflected by the reflection member on the tapered surface, a ratio of exiting from the exit portion substantially without reentering the light conversion member becomes higher than that in the first embodiment. Therefore, secondary light extraction efficiency can be further improved.

Third Embodiment

Figure 7:
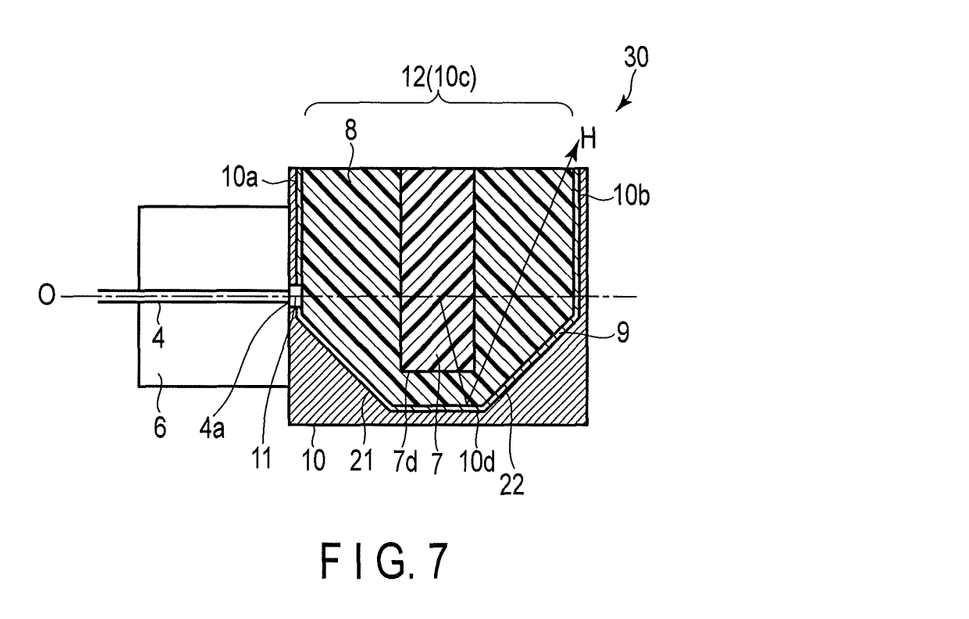
FIG. 7 is a transverse cross-sectional view of a light conversion unit according to a third embodiment.

FIG. 7 is a transverse cross-sectional view of a light conversion unit 30 of a light source apparatus according to a third embodiment.

In the third embodiment, a holder 10 has the same configuration as the second embodiment. That is, first and second tapered surfaces 21 and 22 are formed in the holder 10. Further, a bottom surface 7d of a wavelength conversion member 7 is arranged to be completely apart from a holder bottom surface 10d having a reflection member 9 formed thereon (a floating structure).

In the present embodiment, of wavelength converted light isotropically exiting from the wavelength conversion member 7, a component radiated toward the holder bottom surface 10d facing the bottom surface 7d of the wavelength conversion memory 7 is reflected on the reflection member 9 on the holder bottom surface 10d. Furthermore, part of reflected light is transmitted through a light transmission member 8 and allowed to exit from an exit portion 12 to the outside of the light transmission unit 30 (indicated by an arrow H).

Moreover, when an inclination angle of each of the first and second tapered surfaces 21 and 22 or a gap between the bottom surface 7d of the wavelength conversion member 7 and the holder bottom surface 10d is appropriately set, part of wavelength converted light obtained by changing a light path of the reflected light reflected by the reflection member 9 on a holder incidence surface 10a to a direction of the holder bottom surface 10d is transmitted through the light transmission member 8, reflected on the first tapered surface 21, and allowed to exit from the exit portion 12 to the outside of the light conversion unit 30 without reentering the wavelength conversion member 7.

According to the present embodiment, when the light conversion member is arranged to be completely apart from the holder inner surface, a ratio that the reflected light reflected by the reflection member on the holder inner surface in secondary light isotropically exiting from the light conversion member is caused to reenter the light conversion member is lowered. Thus, light loss due to reentry to the light conversion member can be further reduced as compared with the second embodiment, and secondary light can be efficiently taken out from the exit portion.

It is to be noted that the holder bottom surface 10d may be formed into a concave surface shape (a parabolic surface or a spherical surface) so that the wavelength converted light reflected by the reflection member 9 on the holder bottom surface 10d can efficiently exit to the outside of the light conversion unit 30.

Fourth Embodiment

Figure 8:
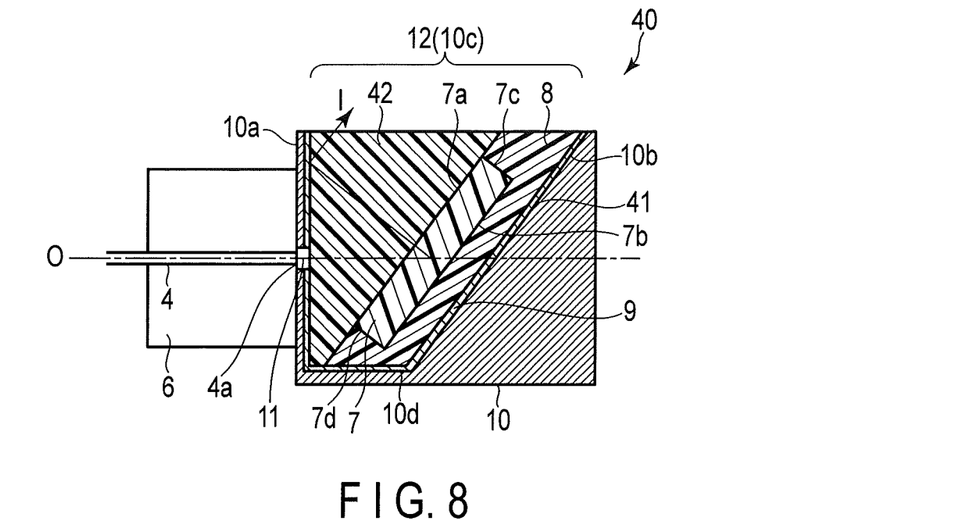
FIG. 8 is a transverse cross-sectional view of a light conversion unit according to a fourth embodiment.

FIG. 8 is a transverse cross-sectional view of a light conversion unit 40 of a light source apparatus according to a fourth embodiment.

In the fourth embodiment, a second holder side surface 10b is inclined to cut across an optical axis so that an area of a holder bottom portion 10d becomes smaller than an area of a holder opening 10c (an exit portion 12) with respect to an optical axis of excitation light exiting from an optical fiber exit end 4a (an incidence portion 11). That is, the second holder side surface 10b forms an inclined surface 41 inclined with respect to the optical axis. A wavelength conversion member 7 is likewise slantingly arranged to cut across the optical axis of the excitation light. Moreover, a bottom surface 7d of the wavelength conversion member 7 is arranged to be completely apart from the holder bottom surface 10d having a reflection member 9 formed thereon like the third embodiment.

Each of first and second side surfaces 8a and 8b of a light transmission member 8 is formed into a tabular shape having the same inclined angle as an inclined angle of the second holder side surface 10b, and the wavelength conversion member 7 is arranged (buried) in the light transmission member 8.

A light transmission member 42 is provided between a holder incidence surface 10a and a light receiving surface 7a of the wavelength conversion member 7. The light transmission member 42 is made of a silicone resin or glass that has a higher refractive index than air and allows primary light or wavelength converted light to be transmitted therethrough in order to fill a gap between an incidence portion 11 and the wavelength conversion member 7 or match refractive indexes with each other. The light transmission member 42 may be made of the same material as the light transmission member 8.

In the present embodiment, the excitation light that has entered from the incidence portion 11 is applied to a first side surface 7a of the inclined wavelength conversion member 7. Additionally, the wavelength converted light isotropically exiting from the wavelength conversion member 7 is strongly radiated in a direction orthogonal to the inclined surface 41. Part of this wavelength converted light is divided into a component that is allowed to directly exit from the exit portion 12 to the outside of the light conversion unit 40 and a component that is reflected by the reflection member 9 on the holder incidence surface 10a. Part of reflected light that has been reflected by the reflection member 9 on the holder incidence surface 10a to change its light path is allowed to exit from the exit portion 12 to the outside of the light conversion unit 40 without reentering the wavelength conversion member 7 (indicated by an arrow I).

According to the present embodiment, when the light conversion member is arranged to be inclined in the direction of the exit portion with respect to the optical axis, a ratio that secondary light exiting from the first side surface of the light conversion member is allowed to directly exit from the exit portion to the outside of the light conversion unit rises as compared with the first embodiment. Therefore, secondary light extraction efficiency can be further improved.

Fifth Embodiment

Figure 9:
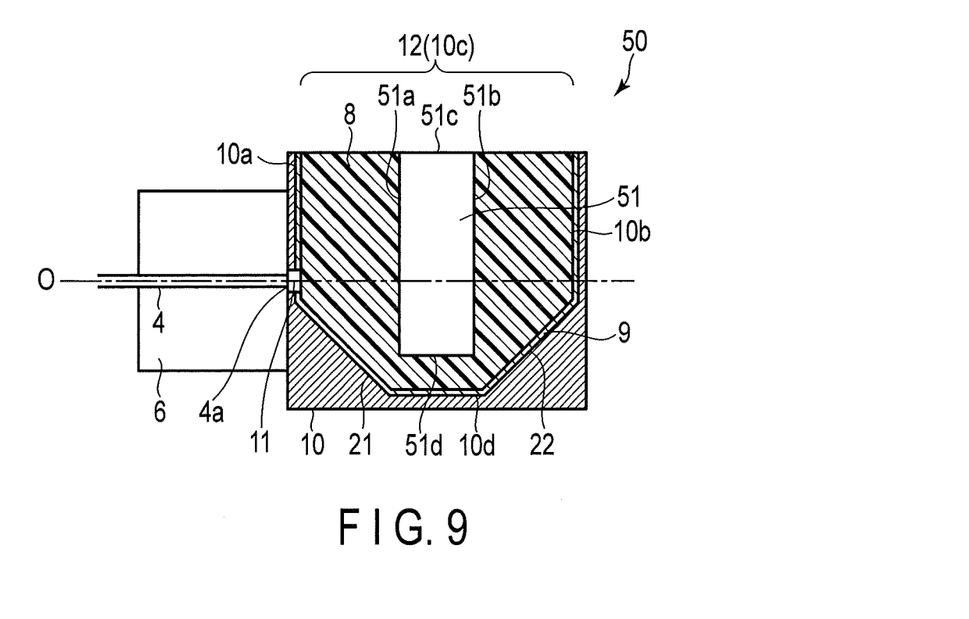
FIG. 9 is a transverse cross-sectional view of a light conversion unit according to a fifth embodiment.

FIG. 9 is a transverse cross-sectional view of a light conversion unit 50 of a light source apparatus according to a fifth embodiment.

In the fifth embodiment, the light conversion unit 50 has a diffusion member 51 as a light conversion member in place of a wavelength conversion member 7. Since a configuration of the light conversion unit 50 is the same as that of the light conversion unit 30 according to the third embodiment, a description thereof will be omitted.

Like the wavelength conversion member 7, the diffusion member 51 is formed into a rectangular shape having a light receiving surface that receives primary light (incident light) exiting from an optical fiber exit end 4a (an incidence portion 11), i.e., a first side surface 51a, a second side surface 51b facing the first side surface 51a, an exit surface through which secondary light (diffused light) exits from the diffusion member 51 to the outside of the light conversion unit 50, i.e., a top surface 51c, a bottom surface 51d facing the top surface 51c, and a third side surface 51e and a fourth side surface 51f bounded on these surfaces.

The diffusion member 51 expands a spread angle of the incident light that has entered the light receiving surface 51a without changing its wavelength and converts the light into the diffused light having weakened coherence. The diffusion member 51 is formed by, e.g., dispersing diffusion particles of alumina or silica having a higher refractive index than that of a sealing material into the transparent sealing material (a transparent member) as a silicone resin and hardening and solidifying the resin. The diffusion particles are, e.g., reflective diffusion particles or transmissive diffusion particles having a higher refractive index than the transparent member.

A difference between an incidence angle of the primary light that has entered the diffusion member 51 and an exit angle of the secondary light exiting from the diffusion member 51 is determined based on, e.g., a particle diameter of the diffusion particles, concentration of the diffusion particles relative to the sealing material, refractive indexes of the sealing material and the diffusion particles, a thickness of the diffusion member 51 on the optical axis, and others. For example, when the particle diameter of the diffusion particles is set to be equal to or approximately 100 times larger than a wavelength of the primary light, the spread angle increases. Further, the concentration of the diffusion particles relative to the sealing material can be widely adjusted in the range of, e.g., approximately 0.1 weight % to approximately 70 weight %.

An area of the light receiving surface 51a of the diffusion member 51 is set so that the light receiving surface 51a is irradiated with substantially all of the primary light exiting from the optical fiber exit end 4a. The light receiving surface 51a is arranged in a region including a range that at least the primary light that has been transmitted through the light transmission member 8 has a light intensity that is at least 1/e times higher than the light intensity of the primary light on the optical axis.

Figure 10:
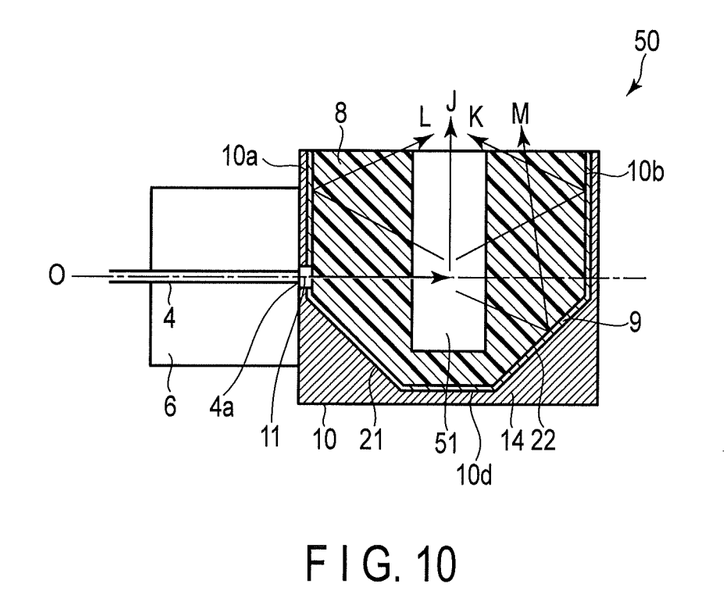
FIG. 10 is a view schematically showing incident light and diffused light in the light conversion unit according to the fifth embodiment.

FIG. 10 is a view schematically showing the primary light and the secondary light in the light conversion unit 50. In the present embodiment, the primary light that has been transmitted through the light transmission member 8 is applied to the light receiving surface 51a of the diffusion member 51, a light distribution angle of the primary light is increased without converting a wavelength of the primary light, and this light is allowed to exit from the diffusion member 51 as the secondary light.

The secondary light exiting from the diffusion member 51 into the holder 10 is divided into a component allowed to directly exit from the exit portion 12 (the exit surface 51c) to the outside of the light conversion unit 50 (indicated by an arrow J) and a component allowed to exit toward a front side and a rear side of the optical axis direction of the primary light and directions of the bottom surface 51d and the first to fourth side surfaces 51a, 51b, 51e, and 51f like the wavelength conversion member 7 according to the first embodiment. The secondary light allowed to exit toward the directions of the bottom surface and the side surfaces is reflected by a reflection member 9 arranged apart from the diffusion member 51, and part of the reflected diffusion light is allowed to exit from the exit portion 12 without reentering the diffusion member 51 (indicated by arrows K, L, and M, for example).

According to the present embodiment, when the light conversion member that diffuses the light distribution angle of the primary light is arranged on the optical axis of the primary light that enters from the incidence portion to be away from the reflection member on the holder inner surface, the primary light that enters from the incidence portion and has high coherence can be converted into the diffused light that is the secondary light obtained by diffusing the primary light with the use of the light conversion member to reduce the coherence. As a result, it is possible to reduce a ratio that part of the diffused light is reflected by the reflection member on the holder inner surface and reenters the light conversion member and to efficiently allow the light to efficiently exit.

Although the respective embodiments according to the present invention have been described above, the present invention is not restricted thereto, and it can be modified and changed in many ways without departing from the gist of the present invention. Further, the configurations of the respective embodiments can be combined.

REFERENCE SIGNS LIST

1 . . . light source apparatus, 2 . . . primary light source, 3 . . . light condensing optical system, 4 . . . light guide member (optical fiber), 5 . . . light conversion unit, 6 . . . ferrule, 7 . . . light conversion member, 7a . . . first side surface (light receiving surface), 7b . . . second side surface, 7c . . . top surface (exit surface), 7d . . . bottom surface, 7e . . . third side surface, 7f . . . fourth side surface, 8 . . . light transmission member, 8a . . . first side surface (incidence surface), 8b . . . second side surface, 8c . . . top surface (exit surface), 8d . . . bottom surface, 8e . . . third side surface, 8f . . . fourth side surface, 9 . . . reflection member, 10 . . . holder, 10a . . . first holder side surface (holder incidence surface), 10b . . . second holder side surface, 10c . . . holder opening, 10d . . . holder bottom surface, 10e . . . third holder side surface, 10f . . . fourth holder side surface, 11 . . . incidence portion, 12 . . . exit portion, 20 . . . light conversion unit, 21 . . . first tapered surface, 22 . . . second tapered surface, 30 . . . light conversion unit, 40 . . . light conversion unit, 41 . . . inclined surface, 42 . . . light transmission member, 50 . . . light conversion unit, 51 . . . diffusion member, 51a . . . first side surface (light receiving surface), 51b second side surface, 51c . . . top surface (exit surface), 51d . . . bottom surface, 51e . . . third side surface, 51f . . . fourth side surface.

What is claimed is:

1. A light converter comprising:
a light guide member which guides a primary light emitted from a primary light source; and
a light conversion unit that converts the primary light guided by the light guide member into secondary light having predetermined optical properties and allows illumination light including the primary light and the secondary light to exit therefrom,
wherein the light conversion unit comprises:
a light conversion member which converts the primary light into the secondary light and radiates the converted light;
a holder which holds the light conversion member; and
a reflection surface which reflects the secondary light,
wherein the holder comprises:
an incidence portion through which the primary light enters from the light guide member; and
an exit portion through which at least part of the secondary light exits in a direction crossing an optical axis of the primary light that enters from the incidence portion,
wherein an exit end of the light guide member is arranged without extending to an interior of the holder,
wherein the light conversion member is arranged on the optical axis of the primary light that enters from the incidence portion, and the light conversion member and the incidence portion are arranged on the optical axis of the primary light and apart from each other in a direction of the optical axis, and
wherein part of the secondary light allowed to exit from the light conversion member in a direction different from a direction extending to the exit portion is reflected by the reflection surface and allowed to exit from the exit portion to the outside without reentering the light conversion member, and part of the primary light which is not converted to the secondary light by the light conversion member is also reflected by the reflection surface and allowed to exit from the exit portion to the outside without reentering the light conversion member.

2. The light converter according to claim 1,
wherein at least part of the light conversion member and the reflection surface is arranged on the optical axis of the primary light that enters from the incidence portion, and
the light conversion member is arranged on the optical axis of the primary light to be apart from the reflection surface on an incidence portion side with respect to the reflection surface.

3. The light converter according to claim 1,
wherein the reflection surface is formed on an inner surface of the holder excluding the incidence portion and the exit portion,
the light conversion member comprises a first surface irradiated with the primary light and a second surface facing the first surface,
the first and second surfaces and the reflection surface are arranged to be apart from each other, and
a light transmission member through which at least part of the primary light and the secondary light is transmitted is arranged between the first and second surfaces and the reflection surface.

4. The light converter according to claim 3,
wherein a concave portion having the exit portion as an opening region is formed in the holder,
the concave portion is formed of a bottom surface facing the opening region and a side surface that is bounded on the opening region and the bottom surface, and
the light conversion member and the light transmission member are arranged in the concave portion.

5. The light converter according to claim 4, wherein a tapered surface inclined in such a manner that an area of the bottom surface becomes smaller than an area of the opening region is formed between the bottom surface and the side surface of the concave portion.

6. The light converter according to claim 5,
wherein the light conversion member and the reflection surface are arranged to be completely apart from each other, and
the light transmission member is arranged between the light conversion member and the reflection surface.

7. The light converter according to claim 6, wherein an area of the first surface of the light conversion member is larger than an area of a beam spot formed on the light conversion member by the primary light that enters from the incidence portion.

8. The light converter according to claim 5, wherein the first surface of the light conversion member has an inclined surface that is inclined with respect to the optical axis of the primary light that enters from the incidence portion.

9. The light converter according to claim 4, wherein the side surface of the concave portion forms an inclined surface that is inclined to cut across the optical axis of the primary light that enters from the incidence portion.

10. The light converter according to claim 9,
wherein the light conversion member and the reflection surface are arranged to be completely apart from each other, and
the light transmission member is arranged between the light conversion member and the reflection surface.

11. The light converter according to claim 10, wherein an area of the first surface of the light conversion member is larger than an area of a beam spot formed on the light conversion member by the primary light that enters from the incidence portion.

12. The light converter according to claim 9, wherein the first surface of the light conversion member has an inclined surface that is inclined with respect to the optical axis of the primary light that enters from the incidence portion.

13. The light converter according to claim 4,
wherein the light conversion member and the reflection surface are arranged to be completely apart from each other, and
the light transmission member is arranged between the light conversion member and the reflection surface.

14. The light converter according to claim 13, wherein an area of the first surface of the light conversion member is larger than an area of a beam spot formed on the light conversion member by the primary light that enters from the incidence portion.

15. The light converter according to claim 4, wherein the first surface of the light conversion member has an inclined surface that is inclined with respect to the optical axis of the primary light that enters from the incidence portion.

16. The light converter according to claim 4, wherein the light conversion member is a wavelength conversion member that absorbs part of the primary light and performs wavelength conversion to provide light in a wavelength domain different from that of the primary light.

17. The light converter according to claim 4, wherein the light conversion member is a diffusion member that increases a light distribution angle of the primary light without converting a wavelength of the primary light.

18. The light converter according to claim 17,
wherein the diffusion member is formed by dispersing diffusion particles in a transparent member through which the primary light is transmitted, and
the diffusion particles are reflective diffusion particles or transmissive diffusion particles having a higher refractive index than that of the transparent member.

19. A light source apparatus comprising:
The light convertor according to claim 1, and
the primary light source, the primary light source being a laser beam source that emits a laser beam in a wavelength domain of visible light.

20. The light converter according to claim 1, wherein the light conversion member and the reflection surface are arranged apart from each other in a first direction on the optical axis of the primary light, from which the primary light enters from the incidence portion, and in a second direction on an axis which is perpendicular to the optical axis.

21. The light converter according to claim 1, wherein the exit end of the light guide member is arranged to the incidence portion of the holder.

22. The light converter according to claim 1, wherein the exit end of the light guide member is in a same plane as the reflection surface located rearward of the light conversion member as viewed in the direction of the optical axis, or is located rearward of the reflection surface as viewed in the direction of the optical axis.

23. A light source apparatus comprising:
the light converter according to claim 1; and
the primary light source which emits the primary light.

* * * * *